(12) United States Patent
Kuwano

(10) Patent No.: US 10,756,530 B2
(45) Date of Patent: Aug. 25, 2020

(54) OVERCURRENT DETECTION CIRCUIT, SEMICONDUCTOR APPARATUS, AND POWER SUPPLY APPARATUS

(71) Applicant: SEIKO EPSON CORPORATION, Tokyo (JP)

(72) Inventor: Toshikazu Kuwano, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 373 days.

(21) Appl. No.: 15/833,327

(22) Filed: Dec. 6, 2017

(65) Prior Publication Data
US 2018/0175607 A1    Jun. 21, 2018

(30) Foreign Application Priority Data

Dec. 19, 2016    (JP) .................................. 2016-245140

(51) Int. Cl.
| | | |
|---|---|---|
| *H02H 3/087* | (2006.01) | |
| *H02M 3/156* | (2006.01) | |
| *H02M 1/32* | (2007.01) | |
| *H01L 27/02* | (2006.01) | |
| *H02M 1/00* | (2006.01) | |

(52) U.S. Cl.
CPC ......... *H02H 3/087* (2013.01); *H01L 27/0266* (2013.01); *H02M 1/32* (2013.01); *H02M 3/156* (2013.01); *H02M 2001/0009* (2013.01)

(58) Field of Classification Search
CPC ........ H02H 3/087; H02M 1/32; H02M 3/156; H02M 2001/0009; H02M 3/158; H02M 2001/0054; H01L 27/0266; H01L 29/78; G01R 19/16571

USPC ........................................................ 361/93.1
See application file for complete search history.

(56) References Cited

U.S. PATENT DOCUMENTS

| | | | | |
|---|---|---|---|---|
| 8,232,781 B2 * | 7/2012 | Marino | ............ | G01R 19/16552 323/271 |
| 2013/0335050 A1 * | 12/2013 | Fujiwara | ............... | G05F 1/10 323/283 |
| 2016/0285290 A1 * | 9/2016 | Takei | ...................... | H02J 7/022 |

FOREIGN PATENT DOCUMENTS

| | | |
|---|---|---|
| JP | 2005-261102 A | 9/2005 |
| JP | 2009-136064 A | 6/2009 |
| JP | 2010-068676 A | 3/2010 |

OTHER PUBLICATIONS

Amami, Hideyuki; Method for Controlling PWM control circuit provided with power mosfet; Date: 2001; Figures, abstract, specification (Year: 2001).*

* cited by examiner

*Primary Examiner* — Dharti H Patel
(74) *Attorney, Agent, or Firm* — Oliff PLC

(57) ABSTRACT

The present overcurrent detection circuit includes: a comparative voltage generation unit that generates a comparative voltage that changes in accordance with a power supply voltage; and a comparison unit that generates a comparison result signal by comparing a drain-source voltage of a switching transistor with the comparative voltage.

14 Claims, 4 Drawing Sheets

OVERCURRENT DETECTION CIRCUIT, SEMICONDUCTOR APPARATUS, AND POWER SUPPLY APPARATUS

This application claims the benefit of the Japanese Patent Application No. 2016-245140, filed on Dec. 19, 2016. The content of the aforementioned application is incorporated herein by reference in its entirety.

BACKGROUND

1. Technical Field

The present invention relates to an overcurrent detection circuit used in, for example, a switching regulator that increases or decreases a power supply voltage. The invention further relates to, for example, a semiconductor apparatus having such an overcurrent detection circuit built therein, and a power supply apparatus that uses such a semiconductor apparatus.

2. Related Art

In a switching regulator that supplies current to an inductor by controlling ON and OFF of a switching transistor of an output circuit, current flowing through the switching transistor is detected in order to prevent the flow of overcurrent, for example. In general, a current sense resistor is connected in series to the switching transistor so as to detect current flowing through the switching transistor based on a voltage generated between the opposite ends of the current sense resistor.

However, connecting the current sense resistor in series to the switching transistor triggers a reduction in the conversion efficiency due to power loss in the current sense resistor. Furthermore, it is required to use a high-precision resistor with a small resistance value as the current sense resistor. Thus, when the current sense resistor is built in a semiconductor apparatus (IC), a special manufacturing process is required. On the other hand, when the current sense resistor is provided as an external component for the IC, the number of terminals of the IC and the total number of components for the IC increase. Therefore, in either case, the cost of a system increases.

As related art, JP-A-2010-68676 discloses a switching power supply that achieves a cost reduction by reducing current detection resistors. This switching power supply includes an ON trigger generation unit, an OFF trigger generation unit, and an overcurrent detection unit. The ON trigger generation unit generates an ON trigger for a switching element by detecting that current flowing through a diode, which supplies energy accumulated in a choke coil to an output capacitor, has substantially reached zero. The OFF trigger generation unit generates an OFF trigger when the ON width determined based on the output voltage is longer than a predetermined value. The overcurrent detection unit detects overcurrent by comparing the source-drain voltage and a predetermined voltage when the switching element is in an ON state.

JP-A-2010-68676 (paragraphs 0007 to 0015 and FIG. 1) is an example of related art.

According to JP-A-2010-68676, overcurrent can be detected using ON resistance of the switching element without using a special element. However, even if the current flowing through the switching element remains the same, the ON resistance of the switching element changes under the influence of a power supply voltage supplied to the switching power supply. Therefore, the source-drain voltage of the switching element in the ON state also changes in a similar manner. For this reason, overcurrent cannot be detected with high precision by simply measuring the source-drain voltage of the switching element.

SUMMARY

A first advantage of some aspects of the invention is to provide an overcurrent detection circuit that can detect overcurrent with high precision without using a current sense resistor that incurs power loss, irrespective of a change in a power supply voltage. A second advantage of some aspects of the invention is to provide a semiconductor apparatus having such an overcurrent detection circuit built therein. A third advantage of some aspects of the invention is to provide a power supply apparatus and the like that use such a semiconductor apparatus.

An overcurrent detection circuit according to a first aspect of the invention includes: a comparative voltage generation unit that generates a comparative voltage that changes in accordance with a power supply voltage; and a comparison unit that generates a comparison result signal by comparing a drain-source voltage of a switching transistor with the comparative voltage, the drain-source voltage changing in accordance with the power supply voltage.

According to the first aspect of the invention, the drain-source voltage of the switching transistor, which changes in accordance with the power supply voltage in an ON state, is compared with the comparative voltage that similarly changes in accordance with the power supply voltage. It is thus possible to provide the overcurrent detection circuit that can detect overcurrent with high precision without using a current sense resistor that incurs power loss, irrespective of the change in the power supply voltage.

Here, it is preferable that the comparative voltage generation unit includes an amplification circuit that generates the comparative voltage by amplifying a difference between a reference voltage independent of the power supply voltage and the power supply voltage. This makes it possible to generate the comparative voltage with a changing property whereby the change in the power supply voltage is amplified by a desired amplification factor.

In this case, it is preferable that the amplification circuit includes an inverting amplification circuit that applies inverting amplification to the difference between the power supply voltage and the reference voltage. Because the drain-source voltage of the switching transistor in the ON state decreases as the power supply voltage increases, the use of the inverting amplification circuit enables generation of the comparative voltage that similarly decreases as the power supply voltage increases.

In the foregoing configurations, it is preferable that the overcurrent detection circuit further includes a second amplification circuit that amplifies the drain-source voltage of the switching transistor, and the comparison unit compares the drain-source voltage of the switching transistor amplified by the second amplification circuit with the comparative voltage. In this way, the drain-source voltage of the switching transistor can be converted into a voltage that is appropriate for comparison.

A semiconductor apparatus according to a second aspect of the invention includes: a switching transistor having a drain connected to an output terminal; the overcurrent detection circuit having any of the foregoing configurations;

and a switching control circuit that restricts current flowing through the switching transistor in accordance with a comparison result signal.

According to the second aspect of the invention, overcurrent is detected with high precision without using a current sense resistor that incurs power loss, irrespective of the change in the power supply voltage. It is thus possible to provide the semiconductor apparatus that can appropriately restrict overcurrent flowing through the switching transistor while suppressing power loss.

Here, it is preferable that the switching control circuit changes a duty cycle of a driving signal for driving the switching transistor in accordance with the comparison result signal. In this way, when overcurrent has been detected, current that flows through the switching transistor can be restricted by shortening a period in which the switching transistor is in the ON state.

Also, it is preferable that the overcurrent detection circuit stops operating when the switching transistor is in an OFF state. When the switching transistor is in the OFF state, overcurrent does not flow through the switching transistor, and thus overcurrent need not be detected. Therefore, as the overcurrent detection circuit stops operating, consumed current can be reduced, and malfunction can be prevented.

Furthermore, it is preferable that the semiconductor apparatus further includes: a semiconductor substrate of a first conductivity type; a first well of a second conductivity type disposed inside the semiconductor substrate; a second well of the first conductivity type disposed inside the first well; a plurality of impurity regions of the second conductivity type that are disposed inside the second well and compose the drain and a source of the switching transistor; a first terminal electrically connected to the semiconductor substrate; and a second terminal electrically connected to the second well and the source of the switching transistor.

As described above, the switching transistor is disposed on the second well that is electrically insulated from the semiconductor substrate. Also, the second terminal that is electrically connected to the second well and the source of the switching transistor is provided separately from the first terminal that is electrically connected to the semiconductor substrate. In this way, the influence of switching noise generated by the switching transistor on other internal circuits can be reduced.

A power supply apparatus according to a third aspect of the invention includes: the semiconductor apparatus having any of the foregoing configurations; and an inductor connected between a first power supply line and the output terminal of the semiconductor apparatus. It is preferable that the power supply apparatus further includes: a diode having an anode connected to the output terminal of the semiconductor apparatus; and a capacitor connected between a cathode of the diode and a second power supply line.

According to the third aspect of the invention, overcurrent is detected with high precision without using a current sense resistor that incurs power loss, irrespective of the change in the power supply voltage. It is thus possible to provide the power supply apparatus that has a high conversion efficiency and can appropriately restrict overcurrent flowing through the switching transistor.

BRIEF DESCRIPTION OF THE DRAWINGS

The invention will be described with reference to the accompanying drawings, wherein like numbers reference like elements.

DETAILED DESCRIPTION

Figure 1:
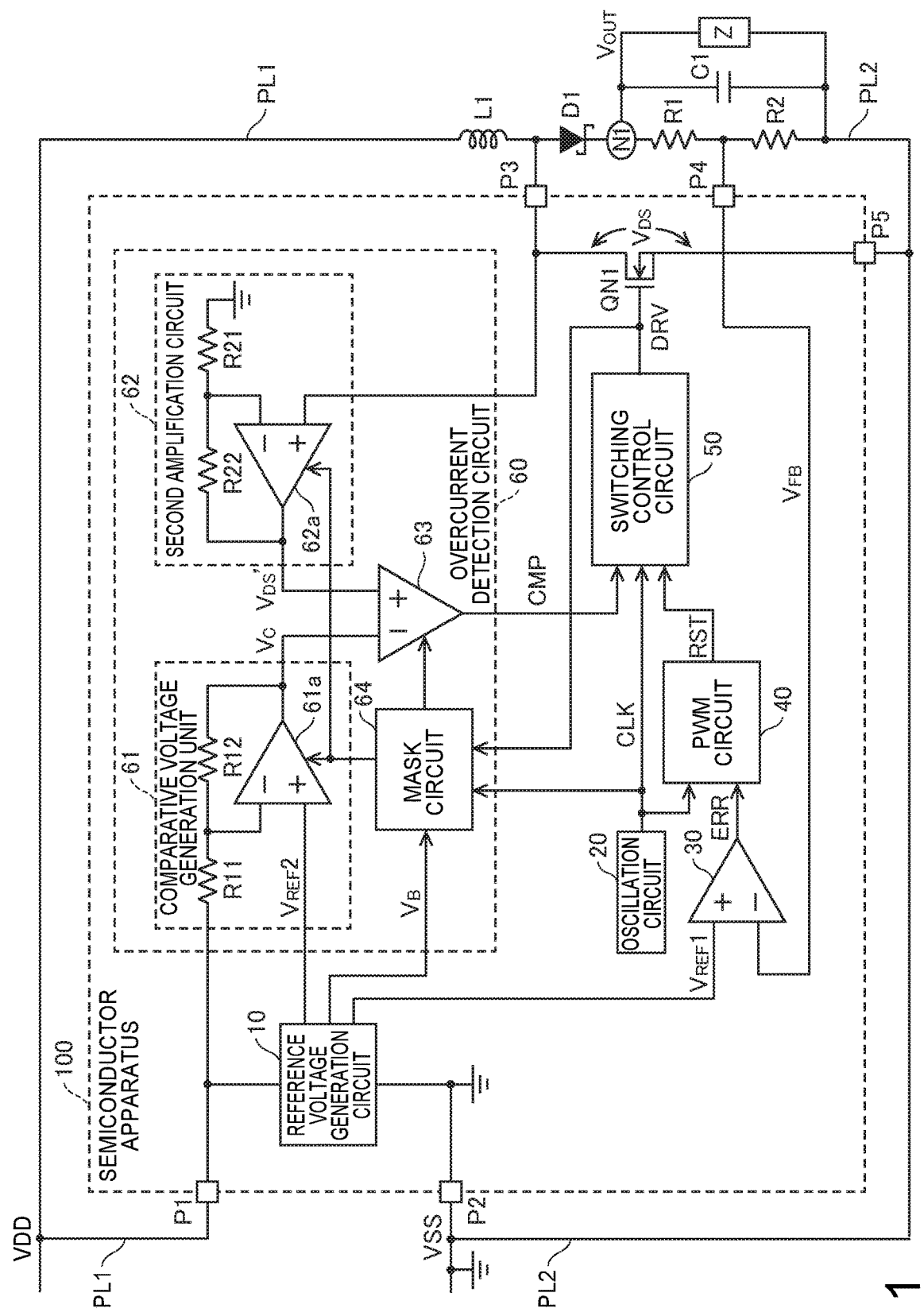
FIG. 1 is a circuit diagram showing an exemplary configuration of a power supply apparatus according to an embodiment of the invention.

The following describes an embodiment of the invention in detail with reference to the drawings. Note that the same constituent elements are given the same reference signs to omit redundant explanations. FIG. 1 is a circuit diagram showing an exemplary configuration of a power supply apparatus according to an embodiment of the invention. In the following embodiment, a switching regulator (a DC-to-DC converter) that steps up a power supply voltage will be described as an example of the power supply apparatus.
Switching Regulator As shown in FIG. 1, this switching regulator includes the following elements according to an embodiment of the invention: a semiconductor apparatus 100, an inductor L1, a diode D1, resistors R1 and R2, and a capacitor C1.

In the switching regulator, a first power supply line PL1 supplies a power supply potential VDD of a high-potential side, and a second power supply line PL2 supplies a power supply potential VSS of a low-potential side. The power supply voltage (VDD-VSS) is stepped up, and the stepped up power supply voltage is supplied from a voltage step-up node N1 to a load Z. FIG. 1 depicts a case in which the power supply potential VSS is a ground potential (0 V).

The semiconductor apparatus 100 includes a reference voltage generation circuit 10, an oscillation circuit 20, an operational amplifier 30, a pulse-width modulation (PWM) circuit 40, a switching control circuit 50, an overcurrent detection circuit 60 according to an embodiment of the invention, a switching transistor QN1, and terminals P1 to P5. Each of the terminals P1 to P5 is a pad mounted on a semiconductor chip, or a pin mounted on a package.

The reference voltage generation circuit 10 includes, for example, a bandgap reference circuit, and generates reference voltages VREF1 and VREF2, which are independent of the power supply voltage, and a bias voltage VB. The oscillation circuit 20 is composed of, for example, a crystal oscillation circuit or a CR oscillation circuit, and generates a clock signal CLK of a predetermined frequency by oscillating.

The reference voltage generation circuit 10 supplies the reference voltage VREF1 (also referred to sometimes herein as a "fixed reference voltage") to a non-inverting input terminal of the operational amplifier 30. A voltage divider circuit composed of the resistors R1 and R2, which are connected in series to the voltage step-up node N1, supplies a feedback voltage VFB to an inverting input terminal of the operational amplifier 30 via the feedback terminal P4. The operational amplifier 30 amplifies a difference between the reference voltage VREF1 and the feedback voltage VFB, and outputs an error signal ERR from an output terminal.

Based on the error signal ERR supplied from the operational amplifier 30, the PWM circuit 40 generates a reset signal RST, which is used to apply pulse-width modulation to the clock signal CLK supplied from the oscillation circuit 20. For example, the PWM circuit 40 generates a triangle wave signal in synchronization with the rise of the clock signal CLK, and deactivates the reset signal RST to a low level in a period in which the triangle wave signal is lower in potential than the error signal ERR. On the other hand, the PWM circuit 40 activates the reset signal RST to a high level when the triangle wave signal is higher in potential than the error signal ERR.

The switching control circuit 50 generates a driving signal DRV with a modulated pulse width based on the clock signal CLK supplied from the oscillation circuit 20 and on the reset signal RST supplied from the PWM circuit 40. For example, in a normal operation state, the switching control circuit 50 activates the driving signal DRV to a high level in synchronization with the rise of the clock signal CLK, and deactivates the driving signal DRV to a low level in synchronization with the rise of the reset signal RST. Note that the high level of the driving signal DRV is substantially equal to the power supply potential VDD, whereas the low level of the driving signal DRV is substantially equal to the power supply potential VSS.

For example, an N-channel MOS transistor is used as the switching transistor QN1. The N-channel MOS transistor includes a drain electrically connected to the output terminal P3, a source electrically connected to the power supply terminal P5, and a gate to which the driving signal DRV is applied. The switching transistor QN1 performs a switching operation in accordance with the driving signal DRV. Specifically, the switching transistor QN1 is placed into an ON state in a period in which the driving signal DRV is activated to the high level, and is placed into an OFF state in a period in which the driving signal DRV is deactivated to the low level.

The inductor L1 is connected between the first power supply line PL1 that supplies the power supply potential VDD and the output terminal P3 of the semiconductor apparatus 100. For example, a PNP bipolar transistor or a P-channel MOS transistor may be connected between the first power supply line PL1 and the inductor L1. The PNP bipolar transistor is turned ON or OFF in accordance with an enable signal that is applied from the semiconductor apparatus 100 to a base.

The diode D1 includes an anode connected to the output terminal P3 of the semiconductor apparatus 100, and a cathode connected to the voltage step-up node N1. For example, a Schottky-barrier diode that has a lower forward voltage and a higher switching speed than a P-N junction diode is used as the diode D1.

The capacitor C1 is connected between the cathode of the diode D1 and the second power supply line PL2 that supplies the power supply potential VSS, and smooths the stepped up power supply voltage VOUT of the voltage step-up node N1. The resistors R1 and R2 are connected in series between the voltage step-up node N1 and the second power supply line PL2, and composes the voltage divider circuit that generates the feedback voltage VFB by dividing the stepped up power supply voltage VOUT of the voltage step-up node N1.

Alternatively, the diode D1 or the resistors R1 and the R2 may be built in the semiconductor apparatus 100. Furthermore, the diode D1 may be replaced with a transistor. In this case, the switching control circuit 50 may perform control so that this transistor and the switching transistor QN1 are placed into an ON state and an OFF state alternately.

The switching transistor QN1 supplies current to the inductor L1 when in the ON state. At this time, the diode D1 is in an OFF state. As the current flows through the inductor L1, electrical energy is converted into magnetic energy and accumulated in the inductor L1.

On the other hand, when the switching transistor QN1 is in the OFF state, the magnetic energy accumulated in the inductor L1 is discharged as the electrical energy to the voltage step-up node N1 via the diode D1. As a result, at the voltage step-up node N1, the power supply voltage (VDD-VSS) is stepped up and the stepped up power supply voltage VOUT is generated, and the capacitor C1 is charged.

The stepped up power supply voltage VOUT of the voltage step-up node N1 is determined by the duty cycle of the driving signal DRV. The duty cycle D of the driving signal DRV is expressed by the following expression using a period in which the driving signal DRV is activated in one cycle T of the clock signal CLK generated by the oscillation circuit 20: $D=VT$, where $0 \leq D \leq 1$.

Overcurrent Detection Circuit

Figure 2:
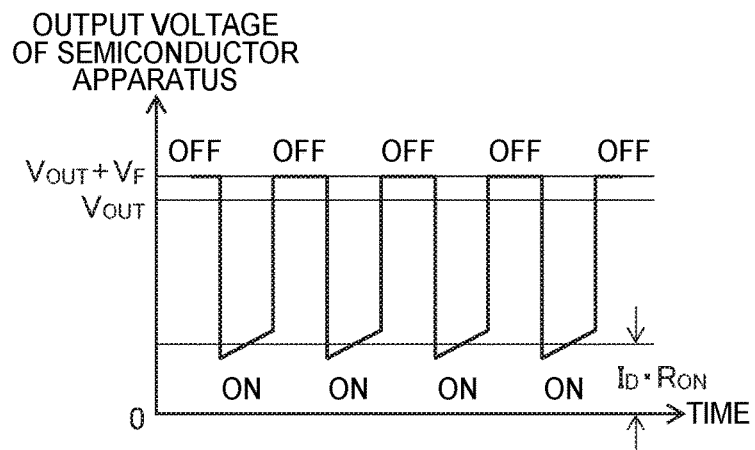
FIG. 2 is a waveform diagram showing a temporal change in an output voltage of a semiconductor apparatus shown in FIG. 1.

FIG. 2 is a waveform diagram showing a temporal change in an output voltage of the semiconductor apparatus shown in FIG. 1. When the switching transistor QN1 is in the OFF state, the output voltage of the output terminal P3 of the semiconductor apparatus is expressed as (VOUT+VF) using the stepped up power supply voltage VOUT of the voltage step-up node N1 and the forward voltage VF of the diode D1.

On the other hand, when the switching transistor QN1 is in the ON state, the output voltage of the output terminal P3 of the semiconductor apparatus (a drain-source voltage VDS of the switching transistor QN1) is expressed as (ID×RON) using a drain current ID of the switching transistor QN1 and ON resistance RON of the switching transistor QN1.

Figure 3:
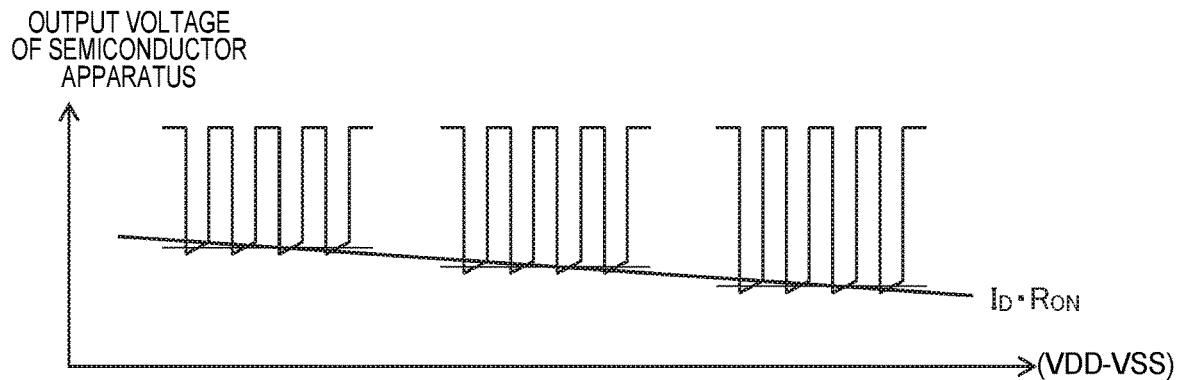
FIG. 3 shows the power supply voltage dependence of the output voltage of the semiconductor apparatus shown in FIG. 1.

FIG. 3 shows the power supply voltage dependence of the output voltage of the semiconductor apparatus shown in FIG. 1. For example, the power supply voltage (VDD-VSS) in the range of 1.8 V to 5.5 V is supplied to the semiconductor apparatus shown in FIG. 1. The ON resistance RON of the switching transistor QN1 decreases as the power supply voltage (VDD-VSS) increases. When the switching transistor QN1 is in the ON state, the output voltage of the semiconductor apparatus (ID×RON) also decreases as the power supply voltage (VDD-VSS) increases.

Therefore, when overcurrent is detected by comparing the drain-source voltage VDS of the switching transistor QN1 with a constant comparative voltage, the precision of the overcurrent detection is not high. If overcurrent cannot be detected despite the occurrence thereof, there is a possibility that the switching transistor QN1 and the like are destructed.

In view of this, the overcurrent detection circuit 60 shown in FIG. 1 includes a comparative voltage generation unit 61 that generates a comparative voltage VC that changes in accordance with the power supply voltage (VDD-VSS), and a comparison unit 63 that generates a comparison result signal CMP by comparing a signal representative of the drain-source voltage (sometimes referred to herein as a drain-source voltage signal) of the switching transistor QN1 with the comparative voltage VC. The overcurrent detection circuit 60 detects overcurrent that flows through the switching transistor QN1.

The comparative voltage generation unit 61 may include an amplification circuit that generates the comparative voltage VC by amplifying a difference between the reference voltage VREF2 that is independent of the power supply voltage (VDD-VSS) and the power supply voltage (VDD-VSS). This makes it possible to generate the comparative voltage VC with a changing property whereby the change in the power supply voltage (VDD-VSS) is amplified by a desired amplification factor.

In this case, the comparative voltage generation unit 61 may include an inverting amplification circuit that applies inverting amplification to the difference between the power supply voltage (VDD-VSS) and the reference voltage VREF2. Because the drain-source voltage of the switching transistor QN1 in the ON state decreases as the power supply voltage (VDD-VSS) increases, the use of the inverting amplification circuit enables generation of the comparative voltage VC that similarly decreases as the power supply voltage (VDD-VSS) increases.

In the example shown in FIG. 1, the comparative voltage generation unit 61 includes an operational amplifier 61a and resistors R11 and R12. When the power supply potential VSS is the ground potential (0 V), the output voltage VOP of the operational amplifier 61a is expressed by the following expression: VOP≈(R12/R11)×(VREF2−VDD)+VREF2. Therefore, the output voltage VOP of the operational amplifier 61a is obtained by applying inverting amplification to a difference between the power supply voltage VDD and the reference voltage VREF2 while using the reference voltage VREF2 as an offset voltage.

The overcurrent detection circuit 60 may further include a second amplification circuit 62 that amplifies the drain-source voltage VDS of the switching transistor QN1. In this way, the drain-source voltage VDS of the switching transistor QN1 can be converted into a voltage that is appropriate for comparison.

In the example shown in FIG. 1, the second amplification circuit 62 includes an operational amplifier 62a and resistors R21 and R22. When the power supply potential VSS is the ground potential (0 V), a closed loop gain G of the operational amplifier 62a is expressed by the following expression: G (R21+R22)/R21. The closed loop gain may be set to approximately ten, for example. In the foregoing configuration, for example, the closed loop gains of the operational amplifiers 61a and 62a may be made adjustable by using variable resistors as the resistors R12 and R22.

The comparison unit 63 is composed of, for example, a comparator or an operational amplifier. The comparison unit 63 includes a first input terminal coupled to the output terminal of the comparative voltage generation unit 61 to receive the comparative voltage, a second input terminal to receive the drain-source voltage signal, and an output terminal to output the comparison result signal. When the second amplification circuit 62 is provided, the drain-source voltage signal is the output of the second amplification circuit 62, and the comparison unit 63 compares the drain-source voltage VDS' of the switching transistor QN1 that has been amplified by the second amplification circuit 62 (i.e., the drain-source voltage signal) with the comparative voltage VC.

When the drain-source voltage VDS' is higher than the comparative voltage VC due to the flow of overcurrent through the switching transistor QN1, the comparison unit 63 activates the comparison result signal CMP to a high level. When the drain-source voltage VDS' is lower than the comparative voltage VC in the normal operation state, the comparison unit 63 deactivates the comparison result signal CMP to a low level.

Figure 4:
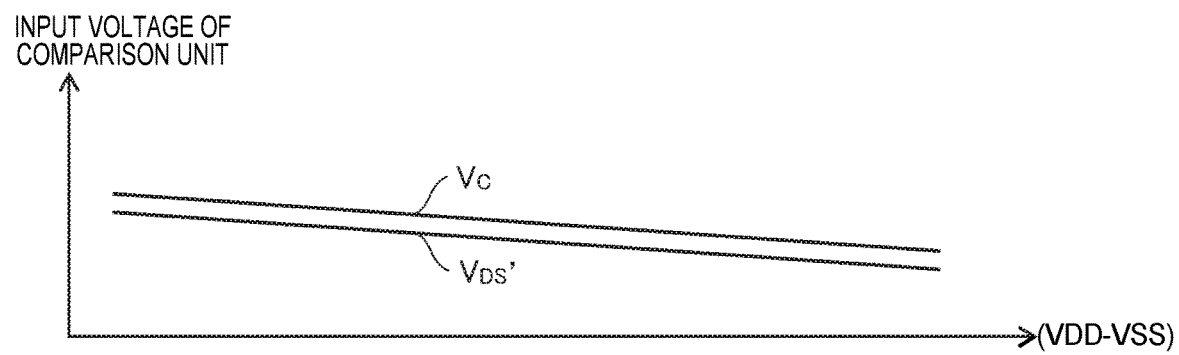
FIG. 4 shows the power supply voltage dependence of an input voltage of a comparison unit shown in FIG. 1.

FIG. 4 shows the power supply voltage dependence of an input voltage of the comparison unit shown in FIG. 1. FIG. 4 shows the input voltage for a case in which the switching transistor QN1 is in the ON state. The drain-source voltage VDS' of the switching transistor QN1 that has been amplified by the second amplification circuit 62 is applied to a non-inverting input terminal of the comparison unit 63. On the other hand, the comparative voltage VC generated by the comparative voltage generation unit 61 is applied to an inverting input terminal of the comparison unit 63.

As shown in FIG. 4, the comparative voltage VC changes in harmony with the power supply voltage (VDD-VSS). Therefore, in the normal operation state in which overcurrent does not flow through the switching transistor QN1, the relationship between the comparative voltage VC and the drain-source voltage VDS' of the switching transistor QN1 can be kept substantially constant, irrespective of the change in the power supply voltage (VDD-VSS).

The overcurrent detection circuit 60 according to the present embodiment compares the drain-source voltage of the switching transistor QN1, which changes in accordance with the power supply voltage (VDD-VSS) in the ON state, with the comparative voltage VC that similarly changes in accordance with the power supply voltage (VDD-VSS). This makes it possible to detect overcurrent with high precision without using a current sense resistor that incurs power loss, irrespective of the change in the power supply voltage (VDD-VSS).

Switching Control Circuit

The switching control circuit 50 restricts current that flows through the switching transistor QN1 in accordance with the comparison result signal CMP supplied from the comparison unit 63. For example, the switching control circuit 50 may change the duty cycle of the driving signal DRV for driving the switching transistor QN1 in accordance with the comparison result signal CMP. In this way, when overcurrent has been detected, current that flows through the switching transistor QN1 can be restricted by shortening a period in which the switching transistor QN1 is in the ON state.

Figure 5:
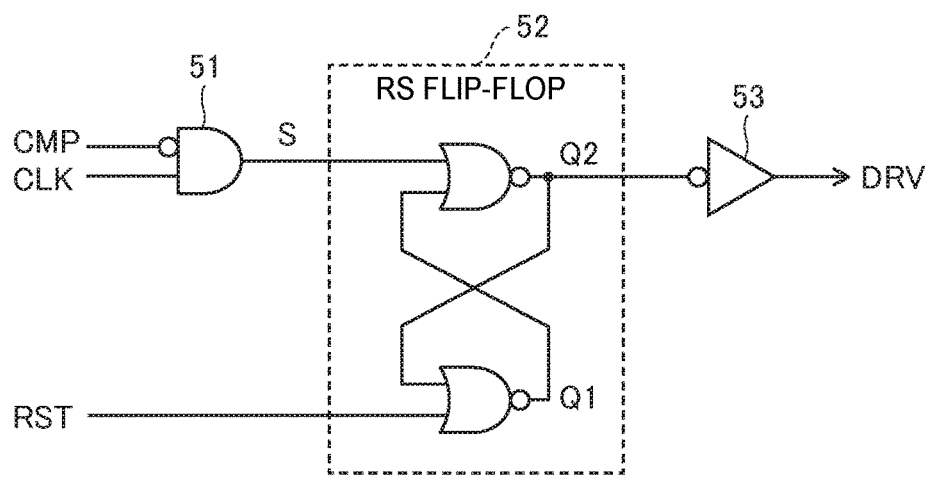
FIG. 5 is a circuit diagram showing a first exemplary configuration of a switching control circuit shown in FIG. 1.

FIG. 5 is a circuit diagram showing a first exemplary configuration of the switching control circuit shown in FIG. 1. According to the first exemplary configuration, the switching control circuit 50 includes an AND circuit 51, an RS flip-flop 52, and an inverter 53. The RS flip-flop 52 is composed of two NOR circuits.

The comparison unit 63 shown in FIG. 1 supplies the comparison result signal CMP to an inverting input terminal of the AND circuit 51. The oscillation circuit 20 shown in FIG. 1 supplies the clock signal CLK to a non-inverting input terminal of the AND circuit 51. Therefore, the AND circuit 51 outputs the clock signal CLK when the comparison result signal CMP is deactivated to the low level, and places an output signal at a low level when the comparison result signal CMP is activated to the high level. The output signal of the AND circuit 51 is used as a set signal S for the RS flip-flop 52.

When the reset signal RST supplied from the PWM circuit 40 shown in FIG. 1 is deactivated to the low level, the RS flip-flop 52 is set in synchronization with the rise of the set signal S supplied from the AND circuit 51, activates a first output signal Q1 to a high level, and deactivates a second output signal Q2 to a low level. Consequently, the inverter 53 outputs the driving signal DRV at the high level.

When the set signal S is deactivated to a low level, the RS flip-flop 52 is reset in synchronization with the rise of the reset signal RST, deactivates the first output signal Q1 to a low level, and activates the second output signal Q2 to a high level. Consequently, the inverter 53 outputs the driving signal DRV at the low level.

When the overcurrent detection circuit 60 shown in FIG. 1 has detected overcurrent, the comparison result signal CMP is activated to the high level, and thus the set signal S is deactivated to the low level. Therefore, even if the clock signal CLK rises after the RS flip-flop 52 is reset, the RS flip-flop 52 is not set; accordingly, the driving signal DRV output from the inverter 53 is maintained at the low level, and the ON duty cycle of the driving signal DRV reaches zero. In this way, the switching control circuit 50 restricts current that flows through the switching transistor QN 1 shown in FIG. 1 by changing the duty cycle of the driving signal DRV so as to maintain the switching transistor QN1 in the OFF state.

Figure 6:
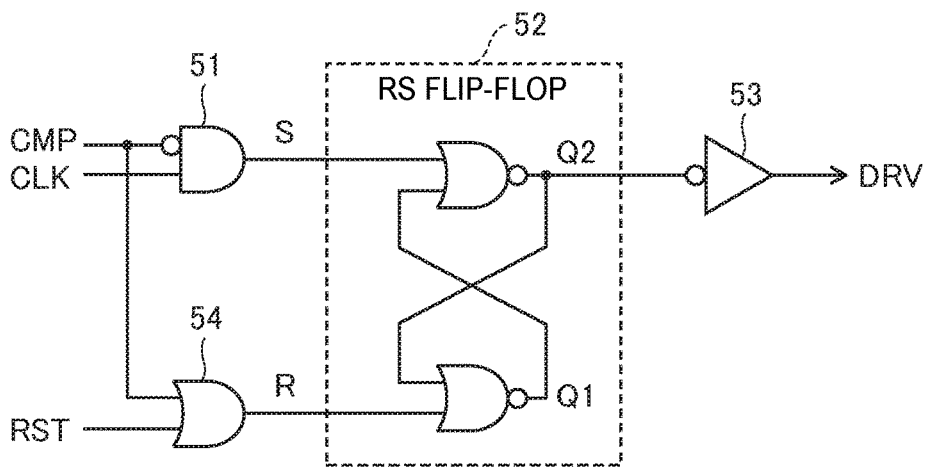
FIG. 6 is a circuit diagram showing a second exemplary configuration of the switching control circuit shown in FIG. 1.

FIG. 6 is a circuit diagram showing a second exemplary configuration of the switching control circuit shown in FIG. 1. According to the second exemplary configuration, the switching control circuit 50 includes an OR circuit 54 in addition to the components of the switching control circuit shown in FIG. 5.

The comparison unit 63 shown in FIG. 1 supplies the comparison result signal CMP to one input terminal of the OR circuit 54. The PWM circuit 40 shown in FIG. 1 supplies the reset signal RST to the other input terminal of the OR circuit 54. Therefore, the OR circuit 54 outputs the reset signal RST when the comparison result signal CMP is deactivated to the low level, and places an output signal at a high level when the comparison result signal CMP is activated to the high level. The output signal of the OR circuit 54 is used as a reset signal R for the RS flip-flop 52.

When the reset signal R supplied from the OR circuit 54 is deactivated to a low level, the RS flip-flop 52 is set in synchronization with the rise of the set signal S supplied from the AND circuit 51, activates the first output signal Q1 to the high level, and deactivates the second output signal Q2 to the low level. Consequently, the inverter 53 outputs the driving signal DRV at the high level.

When the set signal S is deactivated to the low level, the RS flip-flop 52 is reset in synchronization with the rise of the reset signal R, deactivates the first output signal Q1 to the low level, and activates the second output signal Q2 to the high level. Consequently, the inverter 53 outputs the driving signal DRV at the low level.

When the overcurrent detection circuit 60 shown in FIG. 1 has detected overcurrent, the comparison result signal CMP is activated to the high level, and thus the reset signal R is activated to the high level. As a result, the RS flip-flop 52 is immediately reset. Therefore, the driving signal DRV output from the inverter 53 is forcedly placed at the low level, and the ON duty cycle of the driving signal DRV is reduced.

When the comparison result signal CMP is activated to the high level, the set signal S is deactivated to the low level. Therefore, even if the clock signal CLK rises after the RS flip-flop 52 is reset, the RS flip-flop 52 is not set; accordingly, the driving signal DRV output from the inverter 53 is maintained at the low level, and the ON duty cycle of the driving signal DRV reaches zero. In this way, the switching control circuit 50 restricts current that flows through the switching transistor QN 1 shown in FIG. 1 by changing the duty cycle of the driving signal DRV so as to forcedly place the switching transistor QN1 into the OFF state.

Mask Circuit

The overcurrent detection circuit 60 may stop operating when the switching transistor QN1 is in the OFF state. For this reason, the overcurrent detection circuit 60 includes a mask circuit 64 that stops the supply of the bias voltage VB to the operational amplifiers 61a and 62a and the comparison unit 63 when the switching transistor QN1 is in the OFF state.

Figure 7:
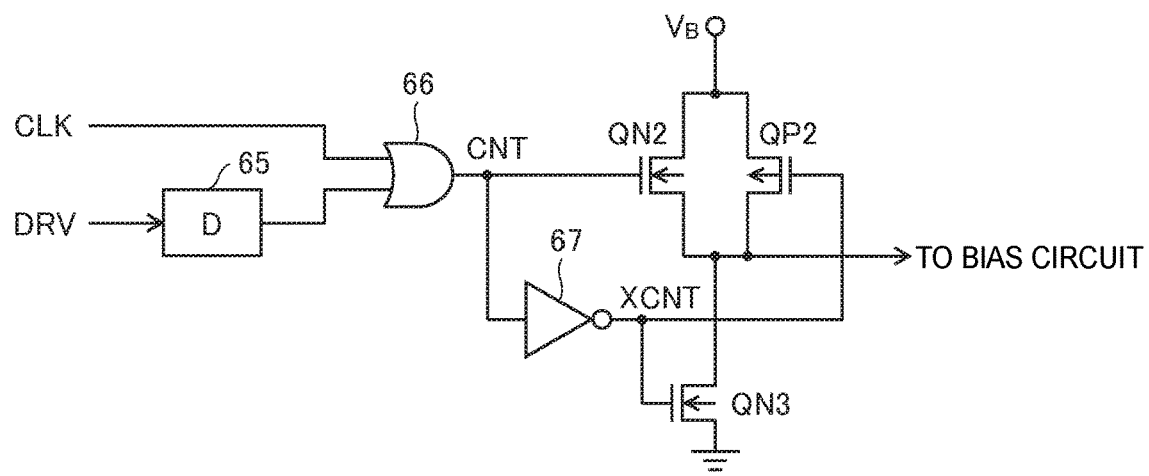
FIG. 7 is a circuit diagram showing an exemplary configuration of a mask circuit shown in FIG. 1.

FIG. 7 is a circuit diagram showing an exemplary configuration of the mask circuit shown in FIG. 1. As shown in FIG. 7, the mask circuit 64 includes a delay element 65, an OR circuit 66, an inverter 67, N-channel MOS transistors QN2 and QN3, and a P-channel MOS transistor QP2.

The delay element 65 is composed of, for example, an even number of inverters that are connected in series, and delays the driving signal DRV supplied from the switching control circuit 50 shown in FIG. 1 by a predetermined delay period. The OR circuit 66 generates a control signal CNT by obtaining a logical sum of the clock signal CLK supplied from the oscillation circuit 20 shown in FIG. 1 and the driving signal DRV delayed by the delay element 65. The inverter 67 outputs an inverted control signal XCNT by inverting the control signal CNT.

The transistors QN2 and QP2 compose an analog switch. When the control signal CNT is at a high level, the analog switch is placed into an ON state and supplies the bias voltage VB to the operational amplifiers 61a and 62a and a bias circuit of the comparison unit 63 (FIG. 1). Consequently, the operational amplifiers 61a and 62a and the comparison unit 63 operate.

On the other hand, when the control signal CNT is at a low level, the analog switch composed of the transistors QN2 and QP2 is placed into an OFF state, the transistor QN3 is placed into an ON state, and the bias voltage VB is not supplied to the operational amplifiers 61a and 62a and the bias circuit of the comparison unit 63. Consequently, the operational amplifiers 61a and 62a and the comparison unit 63 stop operating.

Referring back to FIG. 1, when the switching transistor QN1 is in the OFF state, overcurrent does not flow through the switching transistor QN1, and thus overcurrent need not be detected. Therefore, as the overcurrent detection circuit 60 stops operating, consumed current can be reduced, and malfunction can be prevented. Note that when the switching transistor QN1 is in the OFF state, the overcurrent detection circuit 60 deactivates the comparison result signal CMP to the low level.

Measure Against Noise

When the switching transistor QN1 performs a switching operation, the inductor L1 and the switching transistor QN1 generate a large switching noise. In view of this, the first power supply line PL1 is arranged so as to supply the power supply potential VDD to the inductor L1 at a position far from the power supply terminal P1 of the semiconductor apparatus 100. As a result, the influence of the switching noise generated by the inductor L1 on the internal circuits of the semiconductor apparatus 100 can be reduced.

The semiconductor apparatus 100 includes the power supply terminal P5 serving as a second terminal that supplies the power supply potential VSS to the source of the switching transistor QN1, in addition to the power supply terminal P2 serving as a first terminal that supplies the power supply potential VSS to the internal circuits other than the switching transistor QN1.

Figure 8:
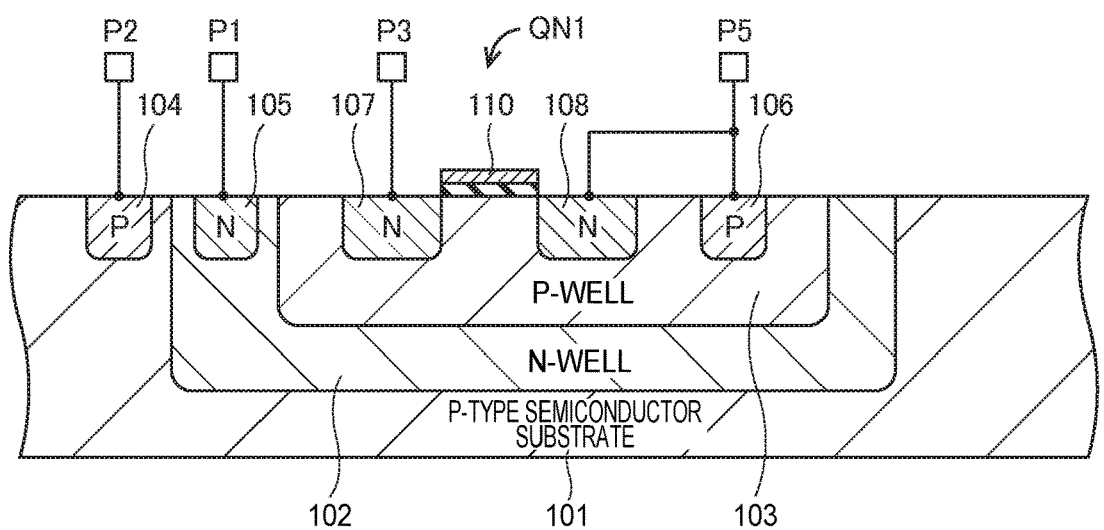
FIG. 8 is a cross-sectional diagram schematically showing a structure of the semiconductor apparatus shown in FIG. 1.

FIG. 8 is a cross-sectional diagram schematically showing a structure of the semiconductor apparatus shown in FIG. 1. As shown in FIG. 8, the semiconductor apparatus 100 has a triple-well structure composed of a P-type semiconductor substrate 101, an N-well 102 serving as a first well disposed inside the semiconductor substrate 101, and a P-well 103 serving as a second well disposed inside the N-well 102.

The semiconductor apparatus 100 also includes a P-type contact region 104 disposed inside the semiconductor substrate 101, an N-type contact region 105 disposed inside the N-well 102, a P-type contact region 106 disposed inside the P-well 103, and a plurality of N-type impurity regions 107 and 108 that are disposed inside the P-well 103 and compose the drain and the source of the switching transistor QN1.

Furthermore, the switching transistor QN1 includes a gate electrode 110 that is disposed on the semiconductor apparatus 100, in which the impurity regions 107 and 108 and the like have been formed, via a gate insulating film. The transistors of the internal circuits other than the switching transistor QN1 are provided in the semiconductor substrate 101, or provided in the normal N-well or P-well disposed inside the semiconductor substrate 101.

For example, a P-channel MOS transistor or a bipolar transistor may be used as the switching transistor. When a P-channel MOS transistor is used as the switching transistor, for example, P-type elements and N-type elements are reversed and the power supply potential VDD and the power supply potential VSS are connected in reverse in FIGS. 1, 8, and the like. When a bipolar transistor is used as the switching transistor, the "drain-source voltage" is replaced with the "collector-emitter voltage" in the present application.

As shown in FIG. 8, the power supply terminal P1 is electrically connected to the N-well 102 via the N-type contact region 105. Note that the N-well 102 may be in a floating state without connecting the power supply terminal P1 to the N-well 102. The power supply terminal P2 is electrically connected to the semiconductor substrate 101 via the P-type contact region 104.

The output terminal P3 is electrically connected to the impurity region 107 that composes the drain of the switching transistor QN1. The power supply terminal P5 is electrically connected to the P-well 103 via the P-type contact region 106, and is also electrically connected to the impurity region 108 that composes the source of the switching transistor QN1.

As described above, the switching transistor QN1 is disposed on the P-well 103 that is electrically insulated from the semiconductor substrate 101. Also, the power supply terminal P5 that is electrically connected to the P-well 103 and the source of the switching transistor QN1 is provided separately from the power supply terminal P2 that is electrically connected to the semiconductor substrate 101. In this way, the influence of the switching noise generated by the switching transistor QN1 on other internal circuits can be reduced.

As described above, according to the present embodiment, overcurrent is detected with high precision without using a current sense resistor that incurs power loss, irrespective of the change in the power supply voltage (VDD-VSS). It is thus possible to provide the semiconductor apparatus 100 that can appropriately restrict overcurrent flowing through the switching transistor QN1 while suppressing power loss. It is also possible to provide the power supply apparatus that has a high conversion efficiency and can appropriately restrict overcurrent flowing through the switching transistor QN1.

Although the switching regulator that steps up the power supply voltage has been described in the foregoing embodiment, the invention is also applicable to a switching regulator that steps down the power supply voltage. As such, the invention is not limited to the foregoing embodiment, and can be modified in various ways by a person of ordinary skill in the art within the technical ideas of the invention.

What is claimed is:

1. An overcurrent detection circuit, comprising:
   a comparative voltage generation unit that generates a comparative voltage that changes in accordance with a power supply voltage;
   a comparison unit that generates a comparison result signal by comparing a drain-source voltage of a switching transistor with the comparative voltage, the drain-source voltage changing in accordance with the power supply voltage; and
   a drain-source voltage amplification circuit that amplifies the drain-source voltage of the switching transistor, wherein
   the comparison unit compares the drain-source voltage of the switching transistor with the comparative voltage by comparing the drain-source voltage of the switching transistor amplified by the drain-source voltage amplification circuit with the comparative voltage.

2. The overcurrent detection circuit according to claim 1, wherein
   the comparative voltage generation unit includes a comparative voltage amplification circuit that generates the comparative voltage by amplifying a difference between the power supply voltage and a reference voltage independent of the power supply voltage.

3. The overcurrent detection circuit according to claim 2, wherein
   the comparative voltage amplification circuit includes an inverting amplification circuit that applies inverting amplification to the difference between the power supply voltage and the reference voltage.

4. A semiconductor apparatus, comprising:
   the switching transistor having a drain connected to an output terminal;
   the overcurrent detection circuit according to claim 1; and
   a switching control circuit that restricts current flowing through the switching transistor in accordance with the comparison result signal.

5. The semiconductor apparatus according to claim 4, wherein
   the switching control circuit changes a duty cycle of a driving signal for driving the switching transistor in accordance with the comparison result signal.

6. The semiconductor apparatus according to claim 4, wherein
   the overcurrent detection circuit stops operating when the switching transistor is in an OFF state.

7. The semiconductor apparatus according to claim 4, further comprising
   a semiconductor substrate of a first conductivity type;
   a first well of a second conductivity type disposed inside the semiconductor substrate;
   a second well of the first conductivity type disposed inside the first well;
   a plurality of impurity regions of the second conductivity type that are disposed inside the second well and compose the drain and a source of the switching transistor;
   a first terminal electrically connected to the semiconductor substrate; and
   a second terminal electrically connected to the second well and the source of the switching transistor.

8. A power supply apparatus, comprising:
the semiconductor apparatus according to claim 4; and
an inductor connected between a first power supply line and the output terminal of the semiconductor apparatus.

9. The power supply apparatus according to claim 8, further comprising:
a diode having an anode connected to the output terminal of the semiconductor apparatus; and
a capacitor connected between a cathode of the diode and a second power supply line.

10. An overcurrent detection circuit, comprising:
a comparative voltage generation unit configured to:
receive a power supply voltage and a fixed reference voltage;
generate a comparative voltage that changes in accordance with a power supply voltage based on the power supply voltage and the fixed reference voltage; and
output the comparative voltage; and
a comparison unit configured to:
receive a drain-source voltage signal representative of a drain-source voltage of a switching transistor, the drain-source voltage changing in accordance with the power supply voltage;
compare the drain-source voltage signal and the comparative voltage output by the comparative voltage generator to generate a comparison result signal; and
output the comparison result signal,
wherein the comparative voltage generation unit comprises an inverting operational amplifier including:
an inverting input terminal to receive the fixed voltage reference,
a non-inverting input terminal to receive the power supply voltage; and
an output terminal to output the comparative voltage, and
wherein the comparison unit comprises one of a comparator or an operational amplifier including:
a first input terminal coupled to the output terminal of the comparative voltage generation unit to receive the comparative voltage;
a second input terminal to receive the drain-source voltage signal; and
an output terminal to output the comparison result signal.

11. The overcurrent detection circuit according to claim 10, further comprising an amplification circuit configured to:
receive the drain-source voltage of the switching transistor;
amplify the drain-source voltage of the switching transistor to generate the drain-source voltage signal; and
output the drain-source voltage signal to the comparison unit.

12. The overcurrent detection circuit according to claim 10, further comprising a mask circuit configured to stop operation of the comparative voltage generation unit and the comparison unit when the switching transistor is in an OFF state.

13. An overcurrent detection circuit, comprising:
a comparative voltage generation unit configured to:
receive a power supply voltage and a fixed reference voltage;
generate a comparative voltage that changes in accordance with a power supply voltage based on the power supply voltage and the fixed reference voltage; and
output the comparative voltage:
a comparison unit configured to:
receive a drain-source voltage signal representative of a drain-source voltage of a switching transistor, the drain-source voltage changing in accordance with the power supply voltage;
compare the drain-source voltage signal and the comparative voltage output by the comparative voltage generator to generate a comparison result signal; and
output the comparison result signal; and
an amplification circuit configured to:
receive the drain-source voltage of the switching transistor;
amplify the drain-source voltage of the switching transistor to generate the drain-source voltage signal; and
output the drain-source voltage signal to the comparison unit.

14. The overcurrent detection circuit according to claim 13, further comprising a mask circuit configured to stop operation of the comparative voltage generation unit and the comparison unit when the switching transistor is in an OFF state.

* * * * *